United States Patent [19]

Krishnamurthy et al.

[11] Patent Number: 5,546,138
[45] Date of Patent: Aug. 13, 1996

[54] AGC SYSTEM WITH OVERRIDING, MAXIMUM GAIN DURING AN INITIAL INTERVAL TO ENHANCE SIGNAL ACQUISITION

[75] Inventors: Gopalan Krishnamurthy, Wheeling; Victor G. Mycynek, Des Plaines; Gary J. Sgrignoli, Mount Prospect, all of Ill.

[73] Assignee: Zenith Electronics Corporation, Glenview, Ill.

[21] Appl. No.: 320,362

[22] Filed: Oct. 11, 1994

Related U.S. Application Data

[63] Continuation-in-part of Ser. No. 174,902, Dec. 29, 1993, abandoned.

[51] Int. Cl.⁶ .......................... H04N 5/50; H04N 5/52
[52] U.S. Cl. .................... 348/735; 348/536; 348/678
[58] Field of Search .................... 348/735, 726, 348/536, 537, 678; 455/260; H04N 5/50, 5/52

[56] References Cited

U.S. PATENT DOCUMENTS

| | | | |
|---|---|---|---|
| 4,300,165 | 11/1981 | Kim | 348/735 |
| 4,309,724 | 1/1982 | Mycynek | 348/735 |
| 4,490,743 | 12/1984 | Mycynek et al. | 348/737 |
| 4,530,005 | 7/1985 | Matsuda | 348/735 |
| 4,823,399 | 4/1989 | George | 348/735 |
| 4,945,415 | 7/1990 | McGinn | 348/735 |
| 5,087,975 | 2/1992 | Citta et al. | 348/726 |

*Primary Examiner*—Victor R. Kostak
*Assistant Examiner*—John W. Miller

[57] ABSTRACT

A dual mode AGC system for a television receiver in which data is in the form of symbols occurring at a fixed symbol rate. The symbols are sent in successive data segments, each having a sync character. Enablement of an AFC Defeat signal defines an initial interval during which the IF gain is maximum. When the AFC Defeat signal becomes inactive, the receiver is operated in a non-coherent mode in which the gain of the IF amplifier is reduced incrementally whenever the IF signal exceeds a clipping level for a period of eight successive symbol clocks. Upon a segment sync lock condition occurring, a normal coherent mode is entered in which the AGC responds to a signal characteristic, i.e. data segment sync. The rate of gain change available in the non-coherent mode is much greater than that in the normal coherent mode.

15 Claims, 6 Drawing Sheets

1

AGC SYSTEM WITH OVERRIDING, MAXIMUM GAIN DURING AN INITIAL INTERVAL TO ENHANCE SIGNAL ACQUISITION

CROSS REFERENCE TO RELATED APPLICATIONS

This application is a continuation-in-part of application Ser. No. 08/174,902 filed Dec. 29, 1993, now abandoned, and contains subject matter claimed in copending application Ser. No. 08/175,333, entitled CARRIER ACQUISITION SYSTEM FOR A SYNCHRONOUS DEMODULATOR now U.S. Pat. No. 5,410,368,; and application Ser. No. 08/174,867, entitled POLARITY SELECTION CIRCUIT FOR BI-PHASE STABLE FPLL, now abandoned, all filed on Dec. 29, 1993 and all assigned to Zenith Electronics Corporation.

BACKGROUND OF THE INVENTION AND PRIOR ART

The present invention relates generally to digital data receivers and particularly concerns a digital television signal receiver.

A number of systems have recently been proposed for transmitting and receiving television signals in a digital form. The television signal may comprise, for example, a compressed wideband HDTV signal or one or more compressed NTSC signals. The two most widely promoted modulation techniques being considered for effecting such transmissions are quadrature amplitude modulation (QAM) and vestigial sideband modulation (VSB). U.S. Pat. No. 5,087,975 discloses a VSB system for transmitting a television signal in the form of successive M-level symbols over a standard 6 MHz television channel, with a relatively small (low level) pilot at the lower edge of the channel. While the number of levels M (i.e., the VSB mode) characterizing the symbols may vary, the symbol rate is preferably fixed, such as at a rate of 684 H (about 10.76 Megasymbols/sec.), where H is the NTSC horizontal scanning frequency. The number of symbol levels used in any particular situation is largely a function of the signal to noise (S/N) ratio characterizing the transmission medium, a smaller number of symbol levels being used in situations where the S/N ratio is low. It is believed that a system accommodating symbol levels of 24, 16, 8, 4 and 2 provides adequate flexibility to satisfy most conditions. It will be appreciated that lower values of M can provide improved S/N ratio performance at the expense of reduced transmission bit rate. For example, assuming a rate of 10.76 Megasymbols/sec., a 2-level VSB signal (1 bit per symbol) provides a transmission bit rate of 10.76 Megabits/sec., a 4-level VSB signal (2 bits per symbol) provides a transmission bit rate of 21.52 Megabits/sec., and so on.

Proper operation of a digital television receiver requires the received carrier signal to be acquired relatively rapidly and the gain of the RF and IF sections to be appropriately adjusted. Carrier acquisition in QAM receivers is relatively difficult because of the absence of any sort of pilot. While the use of a pilot in the above-mentioned VSB system greatly facilitates carrier acquisition, some difficulties may nevertheless be encountered due to the relatively low level of the pilot and the limited pull-in range of synchronous demodulators used in VSB receivers. One aspect of the invention enhances pull in of the FPLL and another deals with an improved AGC system. Also, the frequency and phase locked loop (FPLL) in the synchronous demodulator is bi-phase stable. Consequently, the phase of the output data may be inverted and therefore need to be phase reversed. Further, the lock-up characteristics of the FPLL are determined by the characteristics of the AFC filter and in another aspect of the invention, an improvement in such characteristics is provided. The invention also includes an arrangement for optimizing conversion of the analog signal to digital format when a DC offset is used to generate the pilot.

OBJECTS OF THE INVENTION

It is therefore a basic object of this invention to provide a novel AGC system for a digital data receiver.

It is yet another object of this invention to provide a dual mode automatic gain control (AGC) system for a digital data receiver which facilitates carrier acquisition in the receiver.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

As mentioned above, the transmitted VSB signal preferably includes a small pilot at the lower boundary of the 6 MHz television channel, which is converted to an intermediate frequency (IF) of about 46.69 MHz near the upper boundary of the channel. Also, although not limited thereto, the transmitted signal preferably comprises successive data frames each including 313 data segments. Each data segment includes 832 symbols (occurring at a rate of about 10.76 Megasymbols/sec.), 828 of which are used for data and 4 of which are provided in a fixed position of each data segment for defining a segment sync character. The data segment sync character comprises only 2-level symbols, while the data symbols may be 2, 4, 8, 16 or 24-level depending upon the application. Also, the first data segment of each frame comprises a sequence of 2-level symbols representing a frame synchronization code and a VSB mode control signal identifying the level M (24, 16, 8, 4 or 2) of the data symbols of the remaining 312 data segments of the frame.

The pilot may be conveniently developed in the transmitter by introducing an offset (constant DC level) to the symbol values. In the receiver the offset generates a constant DC which is used for carrier recovery. In accordance with one aspect of the invention, this "recovered" DC in the receiver is eliminated from the data channel, after carrier acquisition, to optimize further processing.

Figure 1:
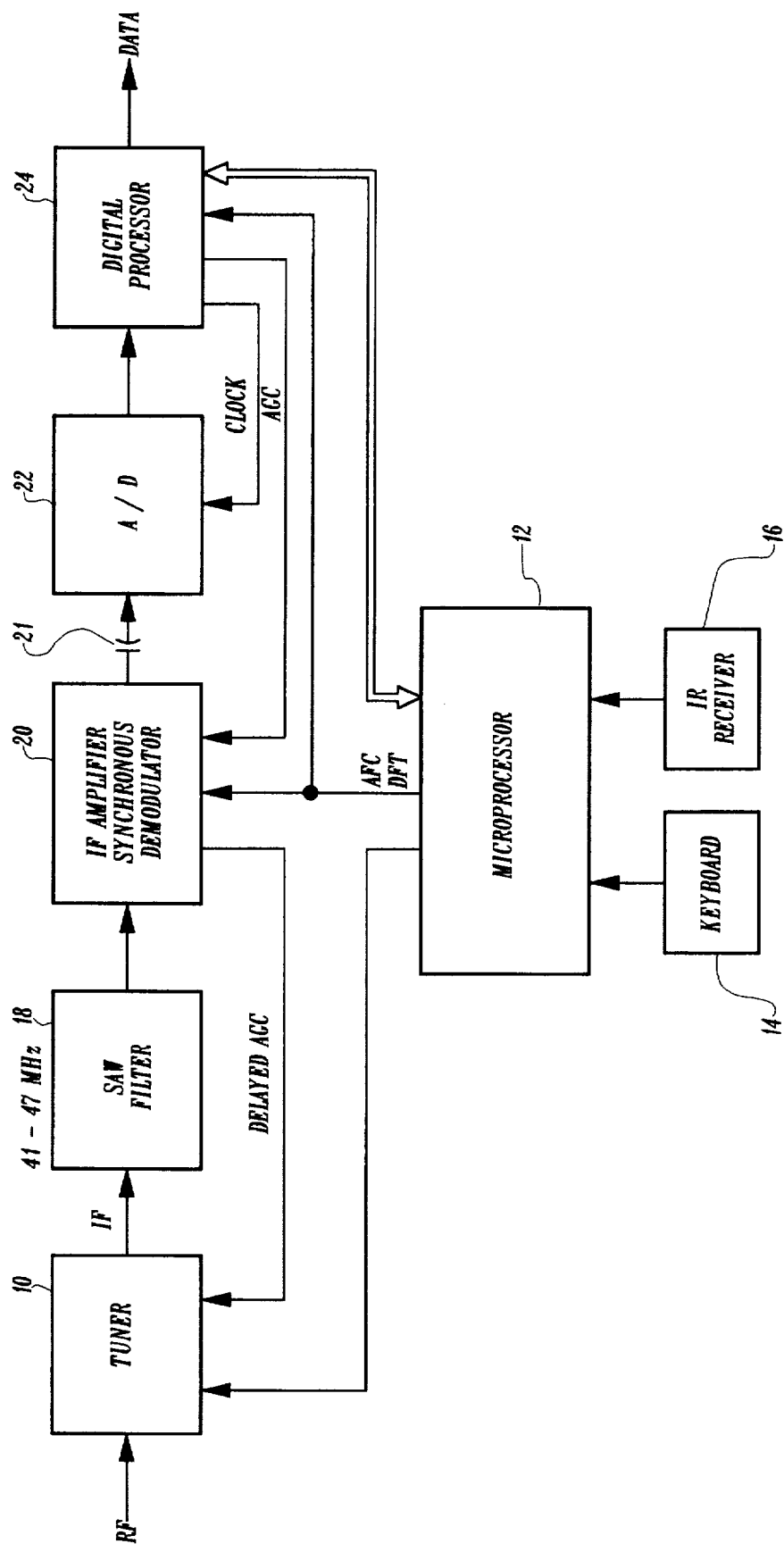
FIG. 1 is a partial block diagram of a receiver constructed for receiving an M-level VSB signal.

Referring to FIG. 1, the received RF signal is converted to an IF signal by a tuner 10, which is controlled by a microprocessor 12. Microprocessor 12 is responsive to user inputs, from either a keyboard 14 or an IR receiver 16, for applying appropriate signals to tuner 10 for tuning the selected channel. The IF signal, including the pilot at 46.69 MHz, is applied from tuner 10 through a SAW filter 18, having a pass-band of about 41–47 MHz, to an IF amplifier and synchronous demodulator 20. The analog baseband output of demodulator 20 is coupled via a capacitor 21 to an analog to digital (A/D) converter 22, which samples the signal and provides the M-level symbols in binary form to a digital processor 24. Capacitor 21 eliminates the DC offset mentioned above from the A/D 22 input. As will be explained in further detail hereinafter, A/D 22 is operated for sampling the output of demodulator 20 at the correct symbol times in response to a clock signal generated by digital processor 24. Digital processor 24 supplies the data and also supplies an AGC control signal to IF amplifier and synchronous demodulator 20 which, in turn, supplies a delayed AGC signal to tuner 10. Both demodulator 20 and digital processor 24 are responsive to an AFC Defeat signal generated by microprocessor 12 in response to selected start-up conditions, such as power-up, channel change and loss of data segment or frame synchronization. Finally, since the phase of the data output may be inverted because the FPLL in the synchronous demodulator is bi-phase stable, an automatic arrangement for providing the proper phase of data is also included. This is described more fully in connection with FIG. 5 and is claimed in copending application Ser. No. 08/174,867, above.

Figure 2:
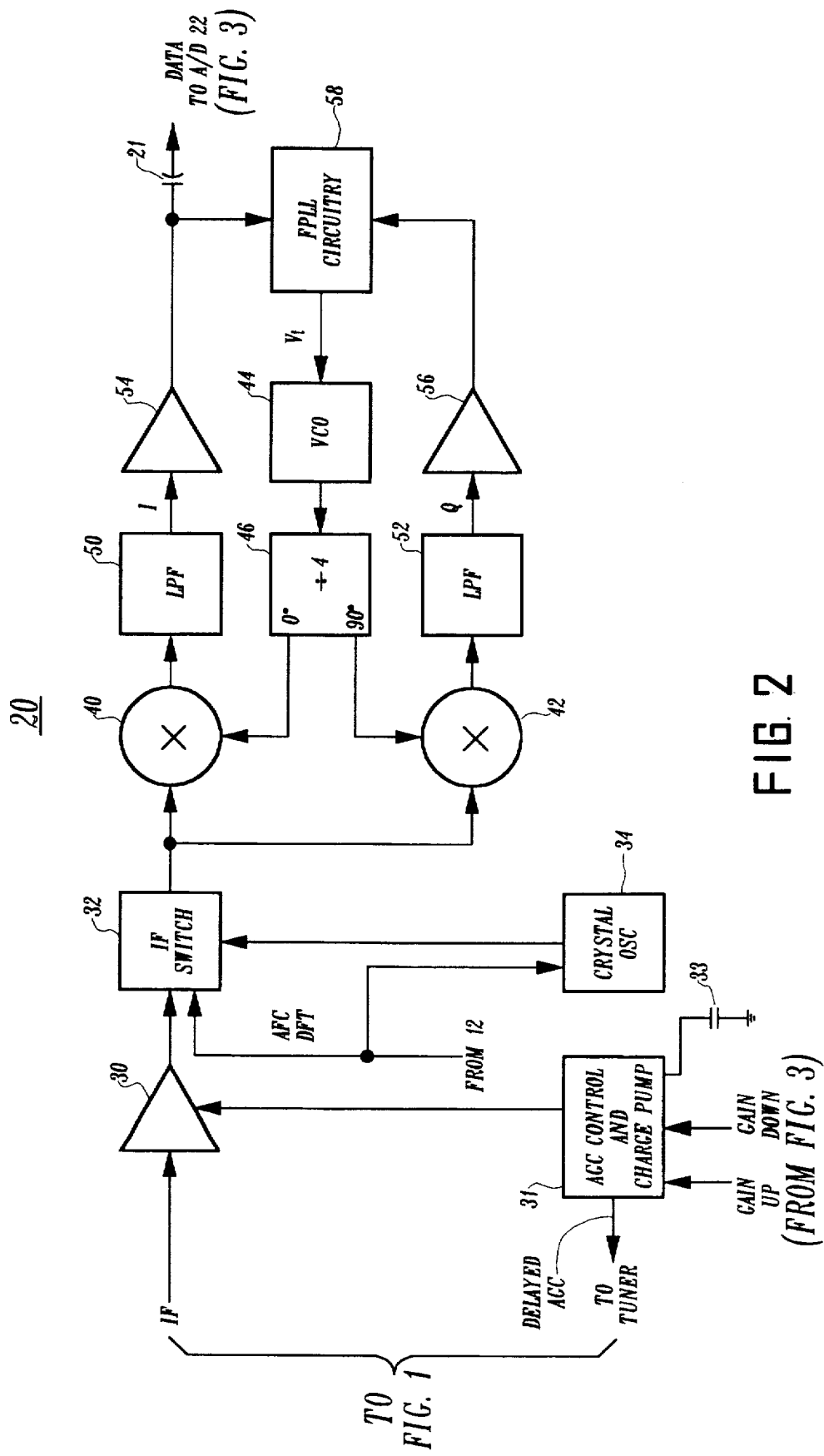
FIG. 2 is a more detailed showing of the IF amplifier and synchronous demodulator of FIG. 1.

IF amplifier and synchronous demodulator 20 is shown in more detail in FIG. 2. The IF signal from SAW filter 18 is applied through a gain controlled amplifier 30 to one input of an IF switch 32. The gain of amplifier 30 is controlled by an AGC control and charge pump 31. Circuit 31 is responsive to Gain-Up and Gain-Down signals for charging and discharging a capacitor 33 to a desired value for controlling the gain of amplifier 30. Circuit 31 also generates a delayed AGC signal for application to tuner 10.

A crystal oscillator 34 is enabled in response to the AFC Defeat signal from microprocessor 12 for applying a relatively strong signal at the frequency of the pilot (46.69 MHz) to a second input of IF switch 32. IF switch 32 is also responsive to the AFC Defeat signal for coupling the output of crystal oscillator 34 to the switch output and is otherwise operable for coupling the output of IF amplifier 30 to its output. Thus the output of IF switch 32 is the IF signal when the AFC Defeat signal is absent, and is the output of crystal oscillator 34 when the AFC Defeat signal is present. This and other related aspects of the invention are separately claimed in copending application Ser. No. 08/175,333, above.

The output of IF switch 32 is applied to the first inputs of a pair of multipliers 40 and 42. A voltage controllable oscillator (VCO) 44 nominally generates an output at a frequency equal to 4×pilot frequency (i.e. 186.76 MHz), which is applied to a divide-by-four prescaler circuit 46 for producing a pair of 90° phase-displaced signals at the pilot frequency. The in-phase (0°) signal is applied to the second input of multiplier 40 to produce an in-phase baseband component I and the quadrature (90°) signal is applied to the second input of multiplier 42 to produce a quadrature baseband component Q. The I and Q components are coupled through respective low-pass filters 50 and 52 to remove second and higher order harmonic mixer products, and amplified by respective amplifiers 54 and 56 to provide desired output levels. The amplified I and Q components are supplied to respective inputs of an FPLL 58, which is operated, in a well known manner, for generating a tuning voltage $V_t$ for locking the frequency and phase of the signal generated by VCO 44 to 4 times the pilot frequency. Capacitor 21, as mentioned above, prevents the DC offset in the I channel signal from being applied to A/D 22. In this manner, the quadrature signals produced by divider 46 are locked to the pilot IF frequency for appropriately demodulating the received IF signal.

During certain start-up types of conditions, such as during power-up or a channel change, the frequency of VCO 44 may be so far from its nominal frequency of 186.76 MHz that rapid lock-up by FPLL 58 in response to the relatively small received pilot cannot occur. (FPLL 58 typically has a pull-in range of only about ±100 KHz at the IF frequency with the weak pilot signal, whereas its pull-in range with a strong signal is typically about ±750 KHz.) To alleviate this problem, according to the invention the relatively strong 46.69 MHz output of crystal oscillator 34 is applied through IF switch 32 to the inputs of multipliers 40 and 42 during an initial interval, which is defined by the duration of the AFC Defeat signal, i.e. AFC Defeat signal is enabled, rather than the received IF signal from IF amplifier 30. The initial interval comprises a fixed period (approximately 200 milliseconds (ms) long) of maximum gain. It will be appreciated that it takes about 1 ms to bring the gain to maximum - - - this is considered part of the initial interval. During the initial interval corresponding to the AFC Defeat signal duration, the IF amplifier gain is held at its maximum level, irrespective of the actual level of the IF signal. Thus during the interval, the AGC system is overridden.

A relatively strong signal, at the frequency of the IF pilot is applied to the synchronous demodulator from crystal oscillator 34, during the initial interval to allow FPLL 58 to rapidly bring the frequency of VCO 44 to its nominal value. After the initial interval, as determined by the absence of the AFC Defeat signal, the IF signal from amplifier 30 is applied to the synchronous demodulator by IF switch 32. Since VCO 44 is now very near the nominal demodulation frequency and the IF amplifier gain is at its maximum, FPLL 58 may readily lock VCO 44 to the frequency and phase (which may be either one of two polarities) of the received pilot to facilitate proper demodulation.

The demodulated data is supplied from the I channel of synchronous demodulator 20, through capacitor 21, to the input of A/D 22 (FIG. 1). A/D 22 is responsive to a clock signal from digital processor 24 for sampling the analog I channel data signal at the correct sampling points and thereby providing a binary I channel data bit stream, representing the amplitudes of the received symbols, to the digital processor. The symbol values are preferably symmetrically disposed about a zero axis and the presence of any DC offset skews the values with respect to the zero axis. In such a case, the A/D 22 would need to process amplitudes that are larger in one direction than in the other. This would necessitate an A/D with more bits for a given level of resolution. Elimination of the DC offset from the data channel by capacitor 21 permits the A/D 22 to see symmetrical inputs and consequently enables optimum utilization of the A/D 22. The clock signal controlling sampling by A/D 22 is preferably generated as disclosed in copending application Ser. No. 07/894,388.

Figure 3:
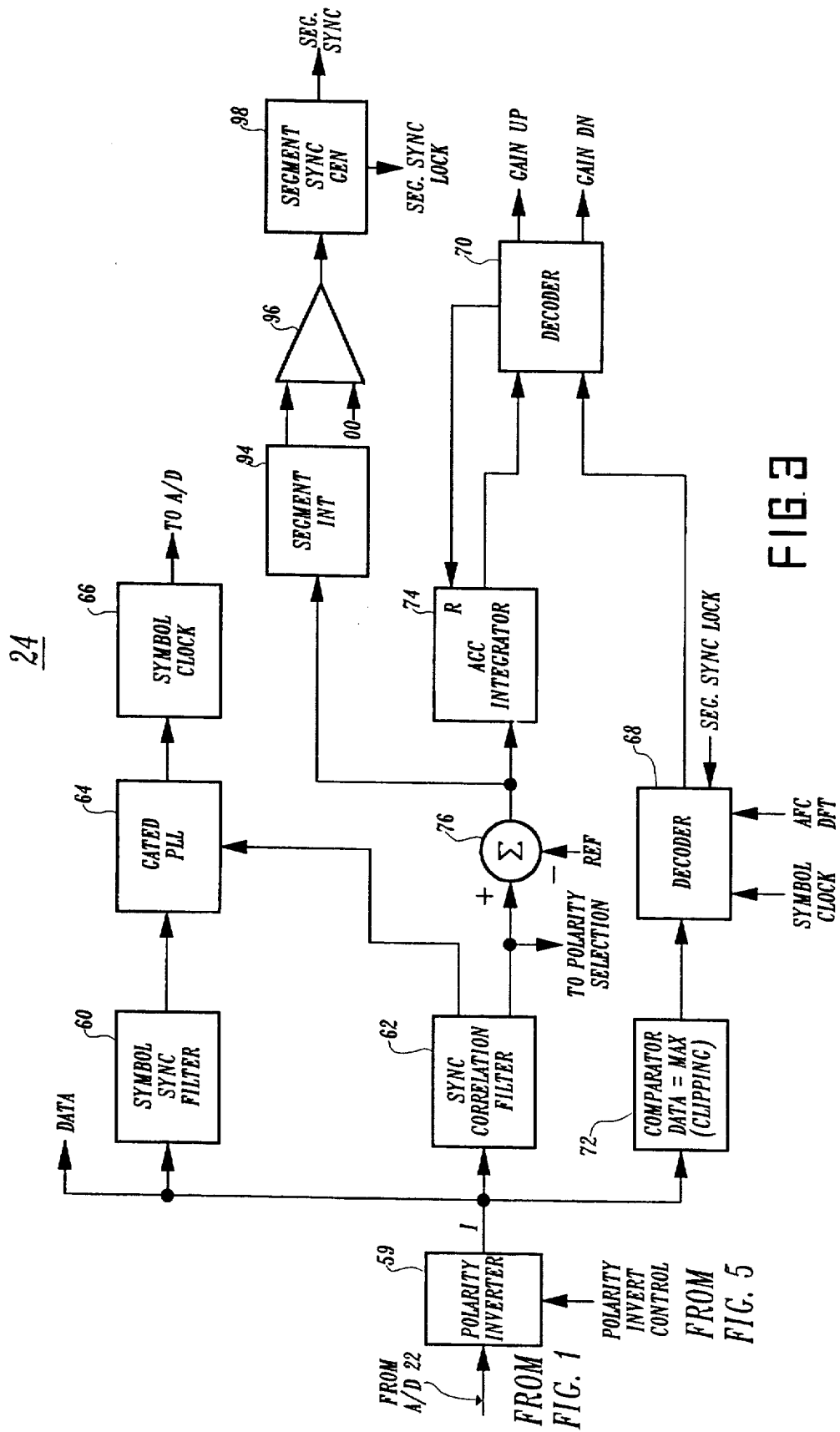
FIG. 3 is the circuit for controlling the AGC for the receiver.

As shown in FIG. 3, which represents the digital processor 24, the binary I channel data bit stream is applied to a polarity inverter 59 (controlled by a polarity invert control signal as will be described in connection with the discussion of FIG. 5) and thence to a symbol sync filter 60 and a sync correlation filter 62. Filter 60 is responsive to each segment sync character for producing a discriminator-type output having a zero-crossing at the center of the sync character. Filter 62 is configured for generating a relatively large pulse coinciding in time with the zero crossing of the output of filter 60. The output of filter 60 is gated into a PLL 64 by the pulse generated by filter 62. A symbol clock generator 66 is properly phased if the gated signal is zero. No corrections to the gated signal are effected by the PLL in this situation. However, if the gated signal is positive or negative, an appropriate error signal is generated by PLL 64 to correct the phase of the symbol clock until the gated signal achieves the desired zero value. As mentioned, this aspect of the invention is claimed in copending application Ser. No. 08/174,867, above.

Figure 4:
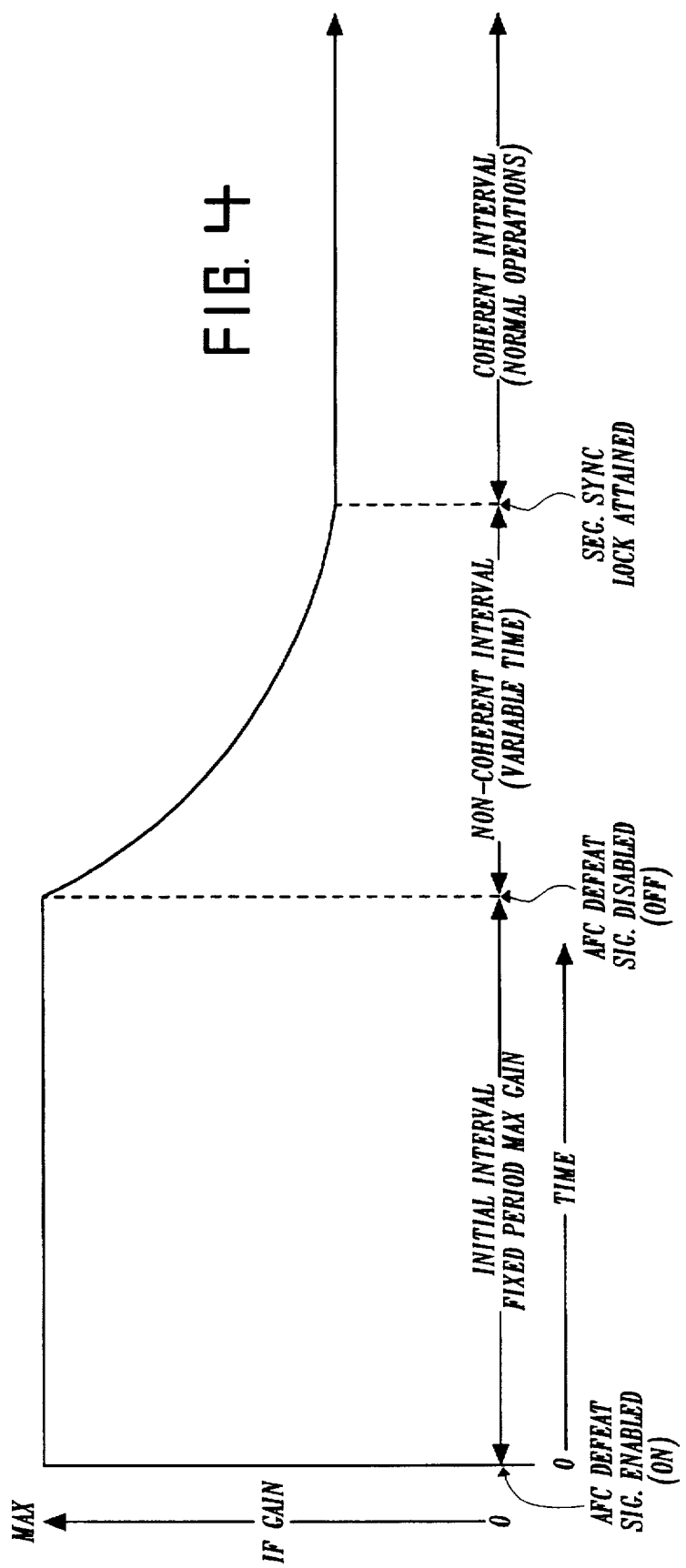
FIG. 4 depicts the operational modes of the AGC circuit.

In order to facilitate lock-up of synchronous demodulator 20, the receiver is operated in a non-coherent AGC mode for a short period after the initial interval, and thereafter is operated in its normal, coherent AGC mode in another, much longer period that corresponds to normal signal reception. These three periods are depicted in FIG. 4. In particular, during the initial interval (i.e., the AFC Defeat signal is enabled due to turn on of the receiver, a channel change or a loss of signal condition), it is desired to operate the IF amplifier 30 at maximum gain for a fixed period to facilitate lock-up by FPLL 58 to the relatively small received pilot in the IF signal. Thereafter, during the non-coherent AGC mode (non-coherent interval) the gain of IF amplifier 30 is rapidly reduced until segment sync lock is attained, after which the AGC is operated in its coherent mode (coherent or normal AGC interval) in which the amplifier gain is controlled relatively slowly as a function of the IF signal amplitude. In the preferred embodiment, the AGC is desired from the segment sync.

More particularly (again referring to FIG. 3), a decoder 68 is responsive to the AFC Defeat signal for causing a second decoder 70 to generate a Gain-Up signal which is applied to charge pump 31 for rapidly increasing the gain of IF amplifier 30 to its maximum independent of input signal strength. This maximum gain is maintained for the duration of the initial interval. After the initial interval, that is when the AFC Defeat signal is disabled, the system enters the non-coherent mode in which the binary I channel data signal is continually compared to a maximum value or clipping level by a comparator 72. If the absolute value of the received data signal exceeds the clipping level for eight consecutive symbols, decoder 68 generates an output causing decoder 70 to generate a Gain-Down signal for reducing the gain of amplifier 31 by a predetermined amount or increment. This continues as long as the condition required by comparator 72 is satisfied. For periods when the condition is not satisfied, no gain reduction occurs. When segment sync lock is attained, decoder 68 is disabled and the receiver enters the coherent AGC mode of operation wherein the gain of amplifier 30 is controlled according to the strength of the received IF signal, for example, as determined from the segment sync character, which is represented by the correlated pulse produced at the output of filter 62. The correlated pulse is applied to a polarity selection circuit (shown in FIG. 5) to assure that the data polarity is correct since FPLL 58 can lock up in either of two phases. A reference level is subtracted from this correlated pulse in a summer 76 and the result is integrated in an AGC integrator 74, the output of which is applied to decoder 70 for controlling the gain of charge pump 31. In particular, when the integrated output of summer 76 exceeds a first level, a Gain-Down signal is generated by decoder 70 to reduce the gain of amplifier 30 and when the integrated signal falls below a second level a Gain-Up signal is generated by decoder 70 to increase the gain of amplifier 30. Integrator 74 is reset by decoder 70 after a Gain-Up or a Gain-Down signal is generated. The output of summer 76 is also applied to a segment sync integrator 94, the output of which is applied to one input of a comparator 96, the other input of which is supplied with a zero signal reference. The output of comparator 96 is supplied to a segment sync generator 98 for providing a segment sync output whenever the integrated correlation pulse from filter 62 is equal to or greater than a zero value and the segment sync lock signal when segment lock has been attained.

The non-coherent AGC operation is relatively fast, being able to effect a gain change every eight symbol clocks. Coherent AGC operation, on the other hand, is responsive to the segment sync character and can thus effect a gain change only once per data segment. It will be appreciated that coherent mode AGC may be responsive to any signal characteristics and this invention is not to be limited to the use of segment sync to develop the AGC voltage.

As mentioned, FPLL 58 in synchronous demodulator 20 is bi-phase stable. Consequently, the phase of the output data may be inverted. The polarity inverter 59 in digital processor 24 inverts the phase of the data signal, if necessary. Polarity inverter 59 is controlled by a signal from the polarity selection circuit shown in FIG. 5.

Figure 5:
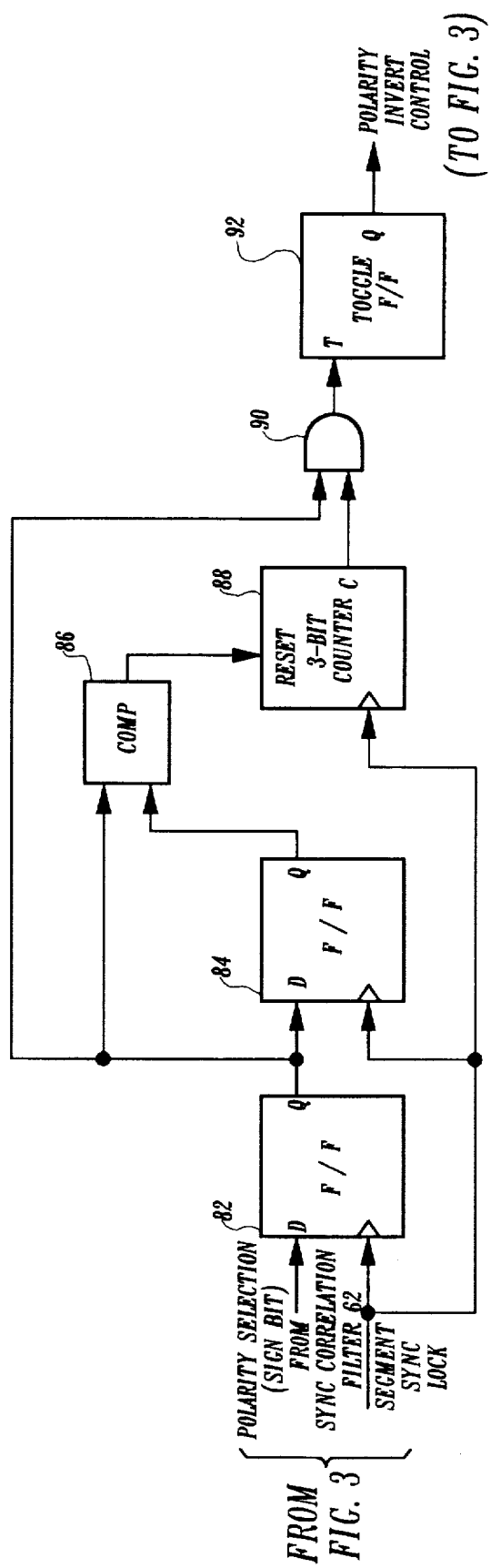
FIG. 5 discloses a data polarity inverter for automatically phase inverting the data, if required.

In FIG. 5, the sign bit of the correlated sync pattern produced at the output of filter 62 is coupled to the D input of a first flip-flop 82, whose Q output is coupled to the D input of a second flip-flop 84 and to one input of a comparator 86, whose second input is supplied with the Q output of flip-flop 84. The output of comparator 86 is applied to the Reset input of a 3-bit counter 88, whose Carry output is coupled to one input of an AND gate 90. A second input of AND gate 90 is supplied with the Q output of flip-flop 82 and the output of the gate is coupled to the toggle input of a toggle flip-flop 92. The Q output of flip-flop 92 comprises the polarity invert control signal which controls the operation of polarity inverter 59. Flip-flops 82–84 and counter 88 are clocked by the segment sync signal derived from segment sync generator 98 (FIG. 3).

The sign bit of the correlated output of filter 62 will be logic 0 when the output of synchronous demodulator 20 is properly phased. If the sign bit is logic 1, inverter 80 will be operated to invert the polarity of the data signal applied to digital processor 24.

More specifically, flip-flops 82 and 84 are operated for storing the sign bits of successive outputs of sync correlation filter 62. Logic 0 and logic 1 sign bits result in flip-flop states of Q=0 and Q=1, respectively. If the sign bit does not change (i.e. no output from comparator 86) for 8 successive segment sync characters, the output of counter 88 enables AND gate 90 for checking the polarity of the current sign bit. If it is not logic 0, i.e. the state of flip-flop 82 is Q=1, AND 90 will produce an output for toggling flip-flop 92, thereby causing polarity inverter 59 to change state. If the sign bit was logic 0, AND gate 90 does not produce an output and the state of inverter 80 is unchanged.

Figure 6:
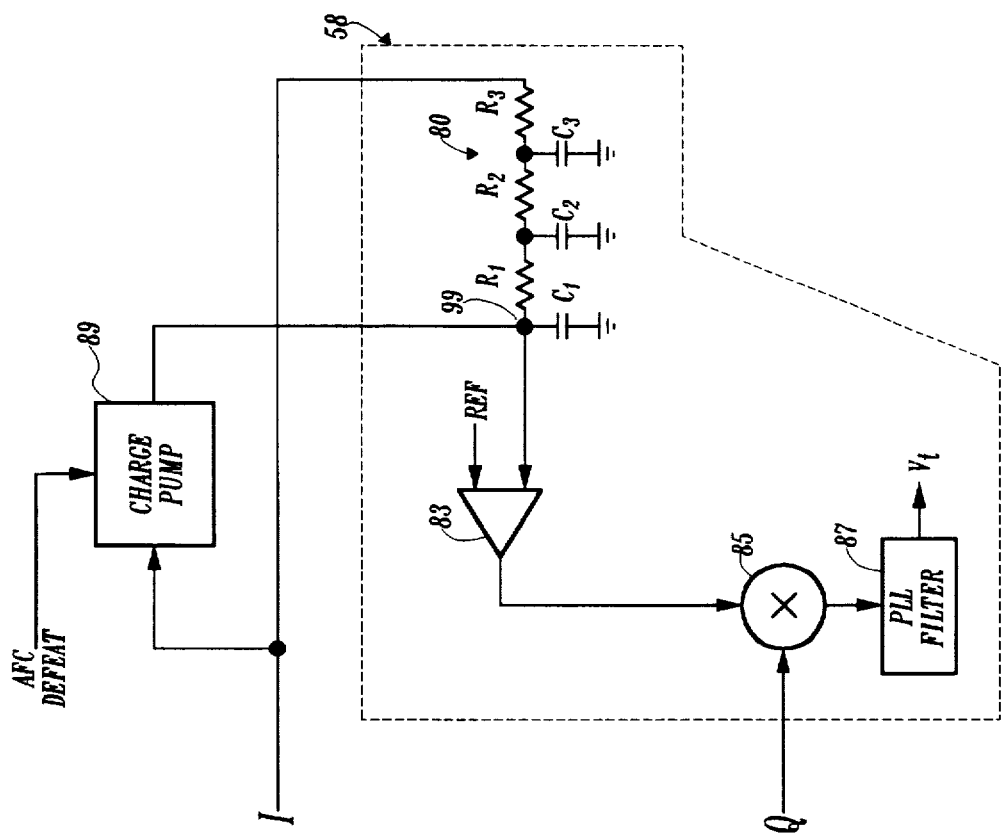
FIG. 6 is a modified PLL filter in accordance with the invention.

FIG. 6 shows a preferred embodiment of FPLL 58 (FIG. 2) which is also responsive to the AFC Defeat signal from microprocessor 12 as described hereinafter. The FPLL conventionally includes an AFC filter 80 comprising a series of resistors R1, R2 and R3 and capacitors C1, C2 and C3. The input of filter 80 is connected for receiving the demodulated I channel data signal and its output is connected to one input of a limiter 82, the other input of limiter 82 being supplied with a reference voltage. The output of limiter 82 is supplied to one input of a multiplier 84. The demodulated Q signal is supplied to a second input of multiplier 84, whose output is connected to a PLL filter 86, which generates the voltage $V_t$ for controlling VCO 44 (FIG. 2).

Figure 7A:
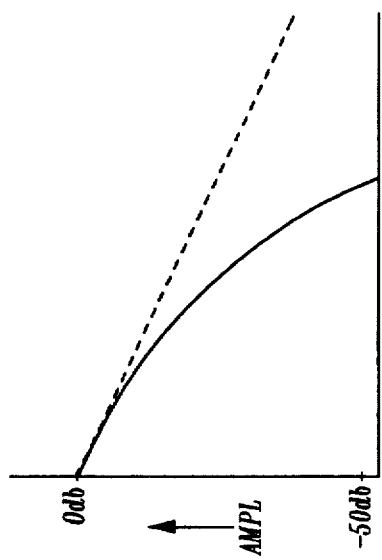
FIGS. 7A and 7B are curves illustrating operation of the FIG. 6 modification.
Figure 7B:
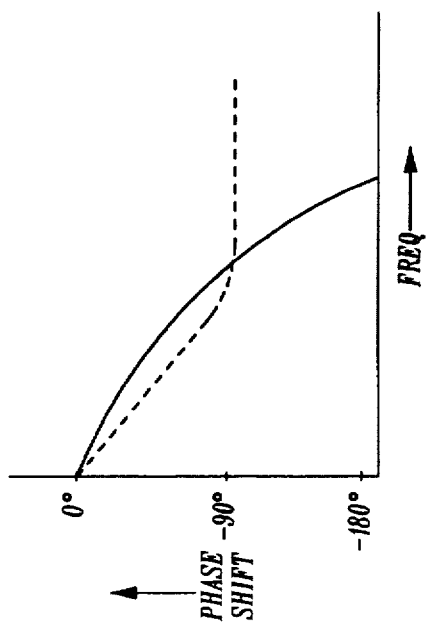

AFC filter 80 has amplitude and phase versus frequency response characteristics as shown in solid line in FIGS. 7A and 7B, respectively, for (1) rejecting the high frequency data components in the I channel data signal and (2) providing a phase shift of the input signal. An error in the frequency of VCO 44 from its nominal demodulating frequency is reflected in the production of beat frequencies in the I and Q signals. As long as the beat frequencies are not excessive, i.e., the frequency of VCO 44 is within a given range of the nominal demodulation frequency, AFC filter 80 will produce an output of sufficient amplitude and phase to allow for correction of the VCO frequency. Such correction is effected by multiplying the limited output of AFC filter 80 with the Q signal to supply a frequency correction signal to PLL filter 86. With reference to FIGS. 7A and 7B, it will be noted that as the beat frequency increases, the amplitude of the AFC filter response decreases and the phase shift imposed thereby approaches 180°. Both of these factors reduce the effectiveness of AFC filter 80 to make the necessary frequency correction. In particular, when the phase shift of the filter exceeds 180°, the frequency of VCO 44 is actually pushed in a direction opposite from that required to achieve frequency lock. During conditions of receiver turn on, channel change or loss of signal, the frequency of VCO 44 can be sufficiently different from its nominal frequency to make acquisition of the received signal very difficult, even when the FPLL is operated in response to the output of crystal oscillator 34.

The foregoing problems are overcome by providing a charge pump 88 which is enabled by the AFC Defeat signal for injecting a current into the output node 90 of AFC filter 80 in response to the I signal. This, in effect, modifies the amplitude and phase response characteristics as shown in dotted line in FIGS. 7A and 7B. It will be seen that the modified amplitude response provides a more gradual rolloff in the amplitude response of the filter with increasing frequency and in the phase shift. The phase shift, more importantly, is essentially fixed at about 90° for increasing frequencies and never gets to 180°. Thus, AFC filter 80 provides an increased level output signal having a phase shift of less than 180° (i.e., about 90°) to facilitate carrier acquisition in response to the output of crystal oscillator 34 during the initial interval.

The following claims are directed to the AGC aspects of the invention, namely the provision of an initial interval of maximum IF amplifier gain whenever the receiver is turned on, a channel change is made or a loss of signal occurs, followed by a coherent AGC mode and a non-coherent AGC mode. It will be appreciated that the invention should only be limited as defined in the claims.

What is claimed is:

1. A method of controlling the gain of an IF amplifier in a data receiver comprising:

operating said IF amplifier at maximum gain during an initial interval;

reducing the gain of said-IF amplifier at a first rate, during a non-coherent operating mode; and controlling the gain of said amplifier, at a second rate slower than said first rate during a coherent operating mode, in response to the signal output of said IF amplifier.

2. The method of claim 1 wherein said initial interval is of fixed time duration.

3. The method of claim 2 wherein, in said non-coherent operating mode, the gain of said IF amplifier is reduced in increments based upon the IF signal exceeding a clipping level for a predetermined time period.

4. The method of claim 3 wherein said receiver receives signals comprising multilevel symbols occurring at a substantially constant symbol rate in repetitive data segments, said first rate exceeding the rate of said repetitive data segments and said second rate being equal to or less than the rate of said repetitive data segments.

5. The method of claim 4, further including initiating said coherent operating mode in response to a segment lock condition being attained.

6. The system of claim 5 wherein said predetermined time period corresponds to eight symbol clocks.

7. A dual mode AGC system for a television receiver comprising:

tuner means for receiving a television signal, including a low level pilot signal, and for producing an IF signal;

phase locked loop means for locking to said pilot signal;

an IF amplifier coupling said IF signal to said phase locked loop means;

AGC means for controlling the gain of said IF amplifier at one rate in a coherent mode;

mode means establishing an initial interval of maximum gain of said IF amplifier; and said mode means overriding said AGC means and reducing the gain of said IF amplifier from a maximum level at another rate, faster than said one rate, during a non-coherent mode immediately following said initial interval.

8. The system of claim 1 wherein said television signal comprises a plurality of data symbols in repetitive data segments, and wherein said mode means during said non-coherent mode reduces said gain of said IF amplifier whenever the level of the received signal is greater than a maximum value for a predetermined number of symbols.

9. The system of claim 7, further including means in said receiver for developing a symbol clock producing symbol clock periods and an AFC Defeat signal; and decoding means in said mode means operable responsive to said symbol clock and to said AFC Defeat signal for defining the beginning of said interval.

10. The system of claim 9 wherein said mode means further includes;

a comparator generating an output in said non-coherent mode whenever the IF signal exceeds said maximum value and enabling said decoding means to reduce the gain of said IF amplifier, said gain of said IF amplifier being reduced one increment for each predetermined number of successive periods of said symbol clock that said IF signal exceeds said maximum value.

11. A dual mode AGC system for a television receiver comprising:

tuner means for receiving a television signal including a low level pilot signal, and for producing an IF signal, said television signal comprising a plurality of data symbols in repetitive data segments;

phase locked loop means for locking to said pilot signal;

an IF amplifier coupling said IF signal to said phase locked loop means;

AGC means for controlling the gain of said IF amplifier at a first rate in a coherent mode;

means in said receiver for developing symbol clock periods and an AFC Defeat signal;

mode means, during a non-coherent mode, overriding said AGC means and reducing the gain of said IF amplifier from a maximum gain at a second rate, higher than said first rate, whenever the level of said IF signal is greater than a clipping level for a predetermined consecutive number of symbols;

decoding means in said mode means operable responsive to said symbol clock and to said AFC Defeat signal for defining commencement of said non-coherent mode; and a microprocessor for determining an initial interval responsive to said AFC Defeat signal, said mode means being controlled by said AFC Defeat signal to operate said IF amplifier at said maximum gain during said initial interval.

12. The system of claim 11 wherein said mode means includes a comparator generating an output whenever said IF signal exceeds said clipping level and enabling said decoding means to reduce the gain of said IF amplifier, said gain of said IF amplifier being reduced in said non-coherent mode one increment for each predetermined consecutive number of said symbol clock periods that said IF signal exceeds said clipping level.

13. A dual mode AGC system for a digital television receiver for receiving a digital television signal including a low level pilot, said digital television signal comprising a plurality of multilevel symbols, occurring at a substantially constant symbol rate in repetitive data segments including data segment sync characters comprising:

tuner means for receiving and detecting said television signal and generating an IF signal;

a gain controllable IF amplifier for said IF signal;

gain control means including a charge pump for increasing and decreasing the gain of said IF amplifier;

means for generating an AFC Defeat signal that defines an initial interval;

means for developing a segment sync signal from said segment sync characters;

means for generating a symbol clock to develop symbol clock periods, and a segment lock signal;

comparator means for comparing the level of said IF signal to a clipping level; and means responsive to said symbol clock, said comparator means, said AFC Defeat signal and said segment lock signal for operating said charge pump to operate said IF amplifier at a maximum gain for said initial interval, reducing the gain of said IF amplifier at a first rate in a non-coherent mode to reduce the level of said IF signal, and thereafter, responsive to said segment lock signal, controlling the gain of said IF amplifier at a second, slower rate in a coherent mode in response to said segment sync signal.

14. The system of claim 13 wherein, in said non-coherent mode, said charge pump is operated to incrementally reduce the gain of said IF amplifier whenever said IF signal exceeds said clipping level for a predetermined successive number of said symbol clock periods.

15. The system of claim 14 wherein said predetermined number is eight.

\* \* \* \* \*

UNITED STATES PATENT AND TRADEMARK OFFICE
CERTIFICATE OF CORRECTION

PATENT NO. : 5,546,138
DATED : Aug. 13, 1996
INVENTOR(S) : Krishnamurthy et al.

It is certified that error appears in the above-identified patent and that said Letters Patent is hereby corrected as shown below:

Column 8,
Claim 8, line 1, change "1" to --7--

Signed and Sealed this

Fifth Day of November, 1996

Attest:

BRUCE LEHMAN

Attesting Officer        Commissioner of Patents and Trademarks